United States Patent
Arata

(10) Patent No.: US 8,612,924 B2
(45) Date of Patent: *Dec. 17, 2013

(54) SUPPORT PROGRAM, SUPPORT APPARATUS, AND SUPPORT METHOD TO CHANGE A DISPLAY ATTRIBUTE OF A COMPONENT IN A DISPLAYED CIRCUIT

(75) Inventor: Akira Arata, Sohara Sawara Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/414,136

(22) Filed: Mar. 7, 2012

(65) Prior Publication Data

US 2012/0236017 A1    Sep. 20, 2012

(30) Foreign Application Priority Data

Mar. 16, 2011    (JP) .................................. 2011-058583

(51) Int. Cl.
*G06F 17/50*    (2006.01)
(52) U.S. Cl.
USPC ........................................................ 716/139

(58) Field of Classification Search
USPC ................... 716/51, 108, 111, 112, 113, 139; 345/581, 589
See application file for complete search history.

(56) References Cited

U.S. PATENT DOCUMENTS

2002/0199160 A1*  12/2002  Fujine ................................ 716/5
2011/0029943 A1*  2/2011   Nonaka ........................ 716/113

FOREIGN PATENT DOCUMENTS

JP    03-088071    4/1991
JP    9-128437     5/1997

* cited by examiner

*Primary Examiner* — Vuthe Siek
(74) *Attorney, Agent, or Firm* — Staas & Halsey LLP

(57) ABSTRACT

A computer-readable medium storing a support program that causes a computer to execute operations, the operations including reading out, from a memory that stores arrangement information on a component on a circuit and analysis information indicating a result of an analysis on the component, the arrangement information on the component and generating image information, reading out the analysis information that is information related to whether or not an examination is to be carried out with respect to the component from the memory, and changing a display attribute of the component which is included in the image information in accordance with the analysis information.

9 Claims, 11 Drawing Sheets

FIG. 3

| NET NAME | NUMBER OF ANALYSES CONDUCTED | VARIATION COMPONENT MODEL USED FOR ANALYSIS 13b | | |
|---|---|---|---|---|
| | | Typ | Min | Max |
| NET A | 3 | ○ | ○ | ○ |
| NET B | 2 | ○ | - | - |
| NET C | 2 | ○ | ○ | - |

SUPPORT PROGRAM, SUPPORT APPARATUS, AND SUPPORT METHOD TO CHANGE A DISPLAY ATTRIBUTE OF A COMPONENT IN A DISPLAYED CIRCUIT

CROSS-REFERENCE TO RELATED APPLICATION

This application is based upon and claims the benefit of priority of the prior Japanese Patent Application No. 2011-58583, filed on Mar. 16, 2011, the entire contents of which are incorporated herein by reference.

FIELD

The embodiments discussed herein are related to a support program, a support apparatus, and a support method.

BACKGROUND

Up to now, an apparatus configured to support a circuit design by a user is proposed. For example, at a stage of the circuit design on a printed circuit board, the apparatus in related art stores a changed part and an unchanged part in a storage apparatus while being distinguished from each other. Then, the apparatus in related art performs a physical design on the unchanged part by using already designed data.

Also, according to the technology in related art, a circuit such as a printed circuit board is produced through a process including a conceptual design by a designer or the like, the circuit design, the physical design, and a fabrication. Also, the produced circuit may be revised through a carryover design in some cases because of various reasons such as an addition of a function, a component revision, and a reduction in size of a casing that accommodates the circuit. In this case, the designer converts physical design data into conceptual design data and examines a wiring, an arrangement, and the like again from the conceptual design.

See Japanese Laid-open Patent Publication No. 3-88071.

SUMMARY

According to an aspect of the invention, a computer-readable medium storing a support program that causes a computer to execute operations, the operations including reading out, from a memory that stores arrangement information on a component on a circuit and analysis information indicating a result of an analysis on the component, the arrangement information on the component and generating image information, reading out the analysis information that is information related to whether or not an examination is to be carried out with respect to the component from the memory, and changing a display attribute of the component which is included in the image information in accordance with the analysis information.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3 illustrates an example of an analysis information DB;

DESCRIPTION OF EMBODIMENTS

However, according to the above-mentioned technology in related art, in a case where the examination is to be carried out again on the wiring, the arrangement, and the like from the conceptual design, it is not simple for a user to determine which parts are parts subjected to a review in the conceptual design, parts where a review is not recommended, parts where a review can be carried out, and the like. For that reason, according to the technology in related art, a problem occurs that an operation in the carryover design is not efficient.

A disclosed technology has been made in view of the above-mentioned circumstances, and an embodiment of the present disclosure provides a support program, a support apparatus, and a support method with which the carryover design can be supported more efficiently.

Hereinafter, respective embodiments of a support apparatus, a support program, and a support method disclosed in the present application will be described in detail on the basis of the drawings. It is noted that this embodiment does not limit the disclosed technology. Then, the respective embodiments can be appropriately combined with each other as long as process contents do not become inconsistent.

First Embodiment

Configuration of Support Apparatus

Figure 1:
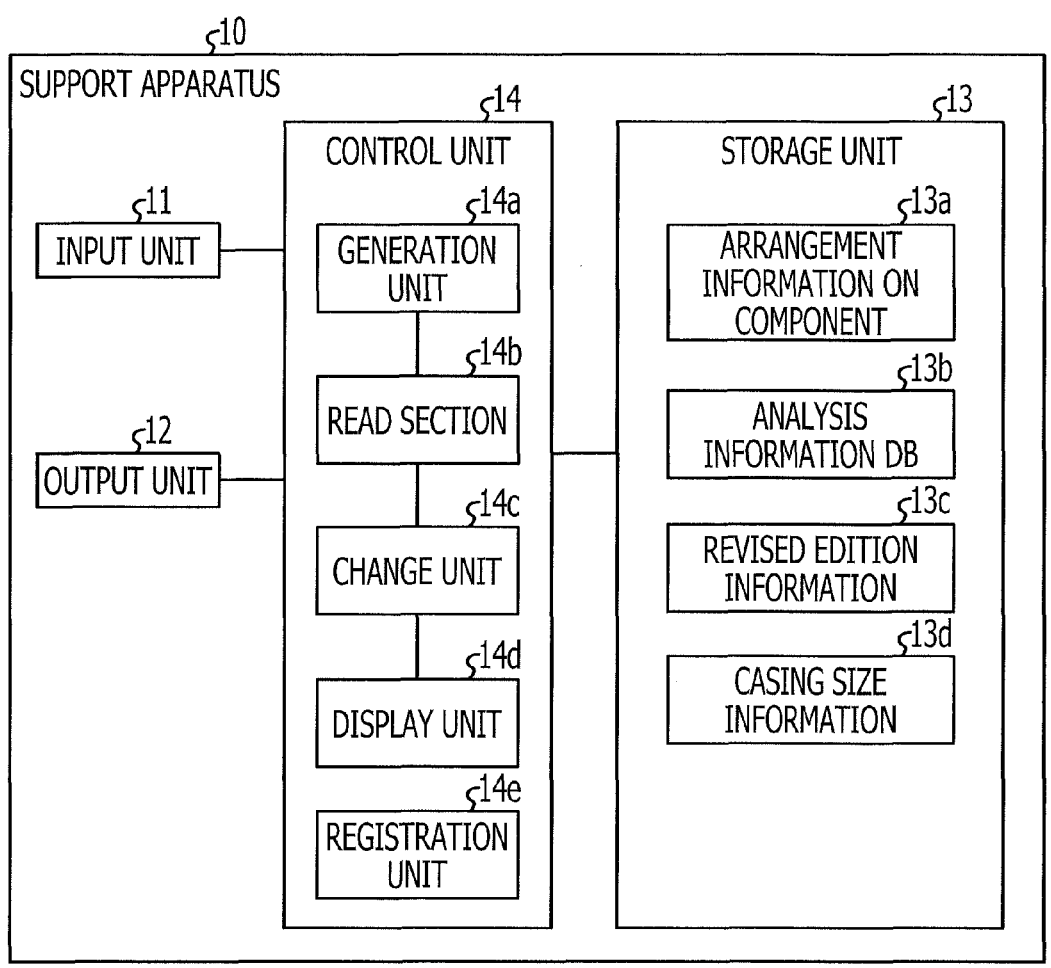
FIG. 1 illustrates a configuration of a support apparatus according to a first embodiment.

A support apparatus according to a first embodiment will be described. FIG. 1 illustrates a configuration of the support apparatus according to the first embodiment. From a storage unit that stores arrangement information on components and analysis information indicating a result of an analysis carried out on the components, a support apparatus 10 according to the present embodiment first reads out the arrangement information on the components and generates image information. Then, the support apparatus 10 according to the present embodiment reads out the analysis information corresponding to the components from the storage unit. Then, the support apparatus 10 according to the present embodiment changes a display attribution on the component included in the image information in accordance with the analysis information.

As illustrated in FIG. 1, the support apparatus 10 has an input unit 11, an output unit 12, a storage unit 13, and a control unit 14.

The input unit 11 inputs various pieces of information to the control unit 14. For example, the input unit 11 accepts an instruction for executing a support process which will be described below from a user and inputs the accepted instruction to the control unit 14. Also, the input unit 11 accepts the arrangement information on the component on the circuit for supporting the circuit design or the like by the designer and inputs the accepted arrangement information on the component to the control unit 14. As an example of the arrangement information on the component, for example, CAD (Computer Aided Design) data is exemplified. Also, the input unit 11 accepts the analysis information indicating the result of the analysis carried out on the components from a signal analysis apparatus 30 which will be described below and inputs the accepted analysis information to the control unit 14. Also, the input unit 11 accepts revised edition information indicating a revision on the component and inputs the accepted revised edition information to the control unit 14. Also, the input unit 11 accepts casing size information which is information related to a size of a casing that is a containment unit containing the circuit and inputs the accepted casing size information to the control unit 14. As an example of a device of the input unit 11, an operation accepting device such as a mouse or a key board is exemplified.

The output unit 12 outputs various pieces of information. As an example of a device of the output unit 12, a display device such as an LCD (Liquid Crystal Display) or a CRT (Cathode Ray Tube) is exemplified. For example, in a case where the output unit 12 is the display device, the output unit 12 displays an image indicated by image information that is transmitted from a display unit 14d which will be described below.

The storage unit 13 stores various pieces of information. For example, the storage unit 13 stores arrangement information 13a on the components, an analysis information DB (Data Base) 13b, revised edition information 13c, and casing size information 13d.

Figure 2:
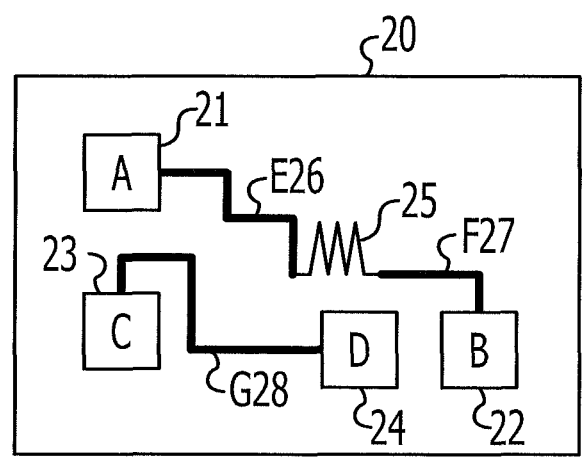
FIG. 2 illustrates an example of respective components on a circuit indicated by arrangement information on the components.

The arrangement information 13a on the components is data indicating an arrangement of the respective components on the circuit. The arrangement information 13a on the components is used by a generation unit 14a which will be described below when image information on the image displayed on the output unit 12 is generated. It is noted that the arrangement information 13a on the components also includes shapes of the respective components. FIG. 2 illustrates an example of respective components on a circuit indicated by arrangement information on the components. According to the example of FIG. 2, a case is illustrated in which on a circuit 20 indicated by the arrangement information 13a on the components, respective components including a component A21, a component B22, a component C23, a component D24, a resistance component 25, a wiring component E26, a wiring component F27, and a wiring component G28 are arranged. According to the example of FIG. 2, the component A21 transmits a signal via the wiring component E26, the resistance component 25, and the wiring component F27 to the component B22. Also, in the example of FIG. 2, the component C23 transmits a signal via the wiring component G28 to the component D24. Herein, the component A21, the component B22, the component C23, and the component D24 are components including, for example, an IC (Integrated Circuit) chip and the like. Also, the wiring component E26, the wiring component F27, and the wiring component G28 are components that transmit a signal. The arrangement information 13a on the components is stored by a registration unit 14e which will be described below in the storage unit 13.

In the analysis information DB 13b, the analysis information on the result of the analysis carried out on the components on the circuit is registered. For example, in the analysis information DB 13b, a "net name" that is a name of a wiring (net) where a signal analysis is carried out, the number of times when the signal analysis is carried out, and a variation component model used for the signal analysis are registered by the registration unit 14e for each wiring where the signal analysis is carried out. FIG. 3 illustrates an example of the analysis information DB. According to the example of FIG. 3, a case is illustrated in which the signal analysis is carried out by 3 times on a wiring having a name of "NET A", that is, the result of the signal analysis in the third time satisfies a predetermined criterion, and the variation component models used for the signal analysis are "Typ", "Min", and "Max". It is noted that in the example of FIG. 3, "O" indicates that the relevant variation component model is used for the signal analysis. On the other hand, in the example of FIG. 3, "-" indicates that the relevant variation component model is not used for the signal analysis. Also, in the example of FIG. 3, a case is illustrated in which the signal analysis is carried out by 2 times on a wiring having a name of "NET B", that is, the result of the signal analysis in the second time satisfies the predetermined criterion, and the variation component model used for the signal analysis is "Typ". Also, in the example of FIG. 3, a case is illustrated in which the signal analysis is carried out by 2 times on a wiring having a name of "NET C", that is, the result of the signal analysis in the second time satisfies the predetermined criterion, and the variation component models used for the signal analysis are "Typ" and "Min".

Figure 4:
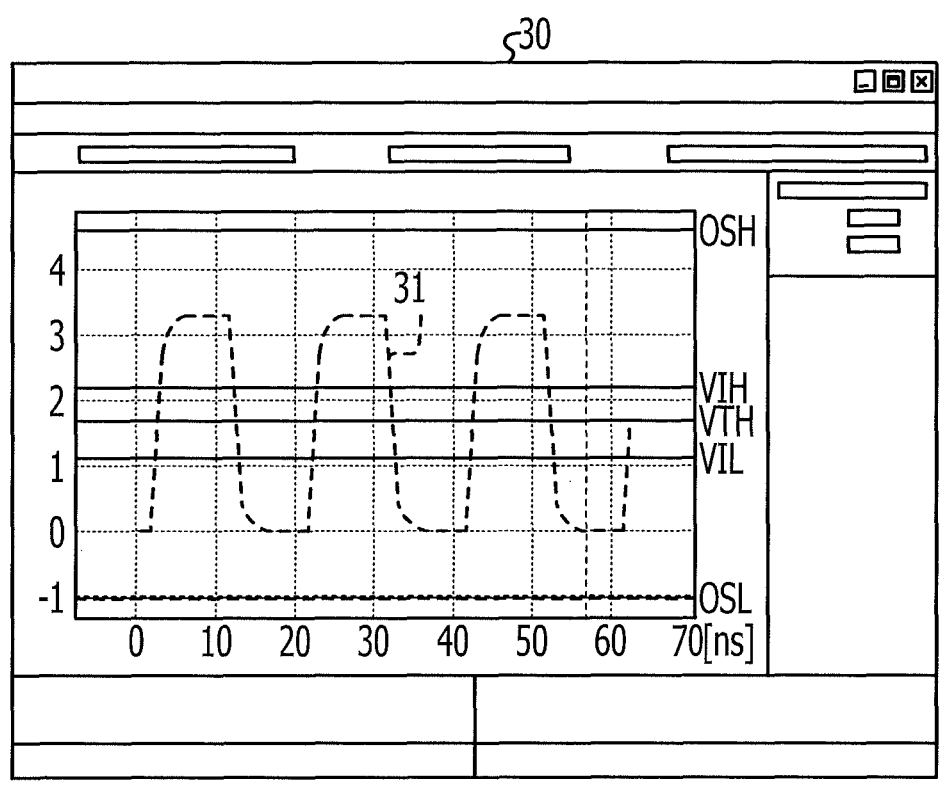
FIG. 4 illustrates an example of a result of a signal analysis.

FIG. 4 illustrates an example of the result of the signal analysis. According to the example of FIG. 4, the analysis result on the signal flowing through a wiring of signal analysis target which is analyzed by the signal analysis apparatus 30 that determines whether or not the signal of the analysis target is normal is illustrated. According to the example of FIG. 4, a signal of the analysis result 31 illustrates a case in which a higher peak exceeds a threshold VIH and a lower peak is below a threshold VIL. In the above-mentioned case, the signal analysis apparatus 30 can perform the analysis in which the signal of the analysis target is normal.

Figure 5:
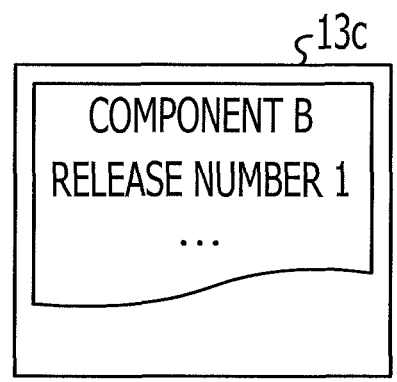
FIG. 5 illustrates an example of revised edition information.
Figure 6:
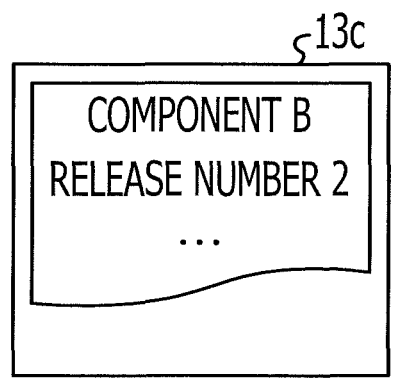
FIG. 6 illustrates an example of the revised edition information.

The revised edition information 13c is revised edition information on the respective components. For example, the revised edition information 13c indicates a release number of the respective components. The release number of the respective components is obtained via the input unit 11 from a component library that manages the release number of the components by a change unit 14c and the registration unit 14e which will be described below. The component library is, for example, an external apparatus and is configured to hold the latest release number of the respective components. Then, the registration unit 14e stores the revised edition information 13c in the storage unit 13. FIG. 5 and FIG. 6 illustrate examples of the revised edition information. According to the example of FIG. 5, a case is illustrated in which a release number of a component B is 1. FIG. 6 illustrates a case in which through a function addition or the like, a revised edition occurs in the component B and the release number of the component B becomes 2.

The casing size information 13d is information indicating a size of a casing storing a circuit. For example, in the casing size information 13d, a region where the respective components on the circuit indicated by the arrangement information 13a on the components can be stored is represented by three-dimensional positional coordinates. In a case where a component exists in the region indicated by the casing size information 13d, it is determined that the component is contained in the casing. On the other hand, in a case where a component is out of the region indicated by the casing size information 13d, it is determined that the component is not contained in the casing. The casing size information 13d is obtained by the registration unit 14e and stored in the storage unit 13.

The storage unit 13 is, for example, a semiconductor memory element such as a flash memory or a storage apparatus such as a hard disc or an optical disc. It is noted that the storage unit 13 is not limited by the above-mentioned type of the storage apparatus and may also be a RAM (Random Access Memory) or a ROM (Read Only Memory).

The control unit 14 has an internal memory for storing a program that prescribes various process procedures and control data and executes various processes by using the program and the control data. As illustrated in FIG. 1, the control unit 14 has the generation unit 14a, a read section 14b, the change unit 14c, the display unit 14d, and the registration unit 14e.

The generation unit 14a reads out the arrangement information 13a on the components from the storage unit 13 that stores the analysis information DB 13b in which the arrangement information 13a on the components on the circuit and the analysis information indicating the result of the analysis on the components are registered and generates image information. For example, the generation unit 14a reads out the arrangement information 13a on the components stored in the storage unit 13. Then, the generation unit 14a generates image information of the image displayed on the output unit 12 on the basis of the locations and the shapes of the respective components indicated by the read arrangement information 13a on the components.

The read section 14b reads out various pieces of information. For example, the read section 14b reads out the analysis information corresponding to the respective components the locations of which are indicated by the arrangement information 13a on the components from the analysis information DB 13b. The read of the analysis information will be described by way of a specific example. The read section 14b searches the analysis information DB 13b while names of the respective components the locations of which are indicated by the arrangement information 13a on the components are used as keys. Then, in a case where a corresponding record is searched for from the analysis information DB 13b, by obtaining a content of the record as the analysis information, the analysis information is read out. Also, the read section 14b reads out the revised edition information 13c stored in the storage unit 13. Also, the read section 14b reads out the casing size information 13d stored in the storage unit 13.

The change unit 14c changes display attributes of the components included in the image information in accordance with the analysis information. For example, among the respective components the locations of which are indicated by the arrangement information 13a on the components, when the carryover design is carried out, the change unit 14c determines the component where the corresponding analysis information is read out as the component where the review is not carried out because the signal analysis is already carried out and the components normally operate. In view of the above, the change unit 14c changes the image information so that a display is made informing that the component where the corresponding analysis information is read out are the component where the review is not recommended, for example, a display is made in a manner that the component is displayed in gray which is less conspicuous than other colors. It is noted that the change unit 14c can also change the display attribute so that the component where the corresponding analysis information is read out is displayed in a color having a lower brightness or saturation as compared with a display of the component where the corresponding analysis information is not read out, that is, the component where the signal analysis is not carried out.

Figure 7:
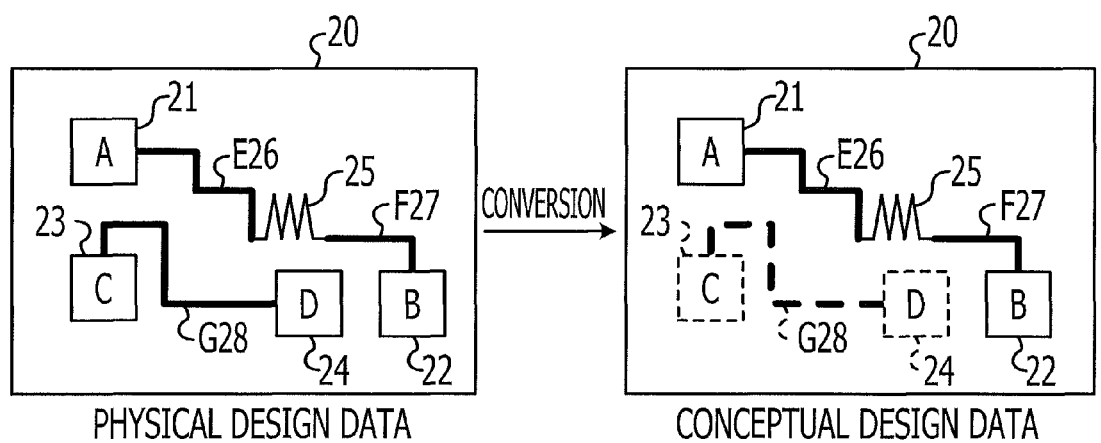
FIG. 7 illustrates an example of an image before and after a change indicated by image information.

FIG. 7 illustrates examples of the image before and after the change indicated by the image information. According to the example on the left side in FIG. 7, the respective components 21 to 27 of the circuit 20 indicated by the image information 13a before the change by the change unit 14c are illustrated. In the case of the example on the left side in FIG. 7, when the analysis information corresponding to the wiring component G28 is read out from the analysis information DB 13b, the change unit 14c performs the following process as illustrated in the example on the right side in FIG. 7. That is, the change unit 14c changes the image information so that a display is made informing that all the components existing in a section from the component C23 that transmits the signal flowing through the wiring component G28 where the signal analysis is carried out until the component D24 that receives this signal are the components where the review is not recommended. According to the example on the right side in FIG. 7, the change unit 14c changes the image information so that a display is made in a manner that the component C23, the wiring component G28, are the component D24 are displayed in gray which is less conspicuous than other colors. The image information changed in the above-mentioned manner is used as the image information on the image displayed on the output unit 12 at the time of the conceptual design in the carryover design. Therefore, at the time of the carryover design, the designer who designs the circuit or the like can figure out which component is the component where the review is not recommended. With this configuration, it is possible to more efficiently support the carryover design.

It is noted that the change unit 14c may perform a display indicating that the component where the corresponding analysis information is read out and also where the number of times when the signal analysis is carried out which is indicated by the analysis information exceeds a predetermined value is the component where the review is not recommended. For example, the change unit 14c may change the image information so that the component where the number of times when the signal analysis is carried out exceeds two is displayed in gray which is less conspicuous than other colors. With this configuration, the designer or the like can figure out that the component where the designer or the like experiences hardships in the signal analysis while the number of times when the signal analysis is carried out exceeds the predetermined value is the component where the review is not recommended at the time of the carryover design. It is noted that the change unit 14c can also change the display attribute so that a display of the component where the number of times when the signal analysis is carried out exceeds the predetermined value is made in a color having a lower brightness or saturation as compared with a display of the component where the number of times when the signal analysis is carried out does not exceed the predetermined value.

Also, the change unit 14c changes the display attribute of the image information on the basis of the revised edition information 13c so that a display is made informing that the component the revised edition of which is generated is the component where the review is recommended. This is because a function may be changed in the component the revised edition of which is generated, and therefore the review is preferably recommended in many cases in the carryover design. For example, the change unit 14c obtains the latest release numbers of the respective components on the circuit 20 indicated by the arrangement information 13a on the components via the input unit 11 from the component library. Then, the change unit 14c compares the release numbers of the respective components on the circuit 20 indicated by the arrangement information 13a on the components which are the release numbers of the respective components indicated by the revised edition information 13c with the obtained latest release numbers of the respective components on the circuit 20 and identifies the component the revised edition of which is generated. Subsequently, the change unit 14c changes the image information so that a display is made informing that the component the revised edition of which is generated is the component where the review is recommended, for example, the component is displayed in red which is more conspicuous than other colors. It is noted that the change unit 14c can also change the display attribute so that a display of the component the revised edition of which is generated is made in a color having a higher brightness or saturation as compared with a display of the component with no revised edition.

Figure 8:
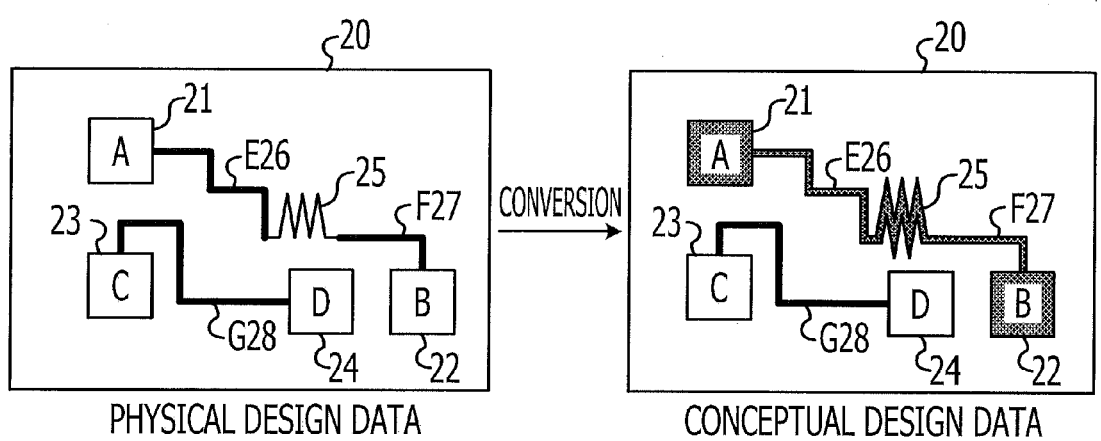
FIG. 8 illustrates an example of the image before and after the change indicated by the image information.

FIG. 8 illustrates an example of the image before and after the change indicated by the image information. According to the example on the left side in FIG. 8, the respective components 21 to 27 of the circuit 20 indicated by the image information 13a before the change by the change unit 14c are illustrated. In the case of the example on the left side in FIG. 8, when the components A21, B22, 25, E26, and F27 are subjected to the revised edition, the change unit 14c performs the following process as illustrated in the example on the right side in FIG. 8. That is, the change unit 14c changes the image information so that a display is made informing that the respective components of the components A21, B22, 25, E26, and F27 are the components where the review is recommended. According to the example on the right side in FIG. 8, the change unit 14c changes the image information so that the components A21, B22, 25, E26, and F27 are displayed in red which is more conspicuous than other colors. The image information changed in the above-mentioned manner is used as the image information on the image displayed on the output unit 12 at the time of the conceptual design in the carryover design. Therefore, at the time of the carryover design, the designer who designs the circuit or the like can figure out which component is the component where the review is recommended. With this configuration, it is possible to more efficiently support the carryover design.

Also, the change unit 14c changes the display attribute of the image information on the basis of the casing size information 13d so that a display is made informing that the component which is not to be contained in the casing is the component where the review is recommended. This is because the component which is not to be contained in the casing is subjected to the review at the time of the carryover: design. For example, the change unit 14c obtains the casing size information 13d via the input unit 11. Then, the change unit 14c identifies the component out of the region indicated by the casing size information 13d among the components on the circuit 20 indicated by the arrangement information 13a on the components. Then, the change unit 14c identifies all the components existing in a section from the component that transmits the signal flowing through the identified component until the component that receives this signal. Subsequently, the change unit 14c changes the image information so that a display is made informing that the identified component is the component where the review is recommended, for example, the component is displayed in red which is more conspicuous than other colors. It is noted that the change unit 14c can also change the display attribute so that the component which is not to be contained in the casing is displayed in a color having a lower brightness or saturation as compared with a display of the component which can be contained in the casing.

Figure 9:
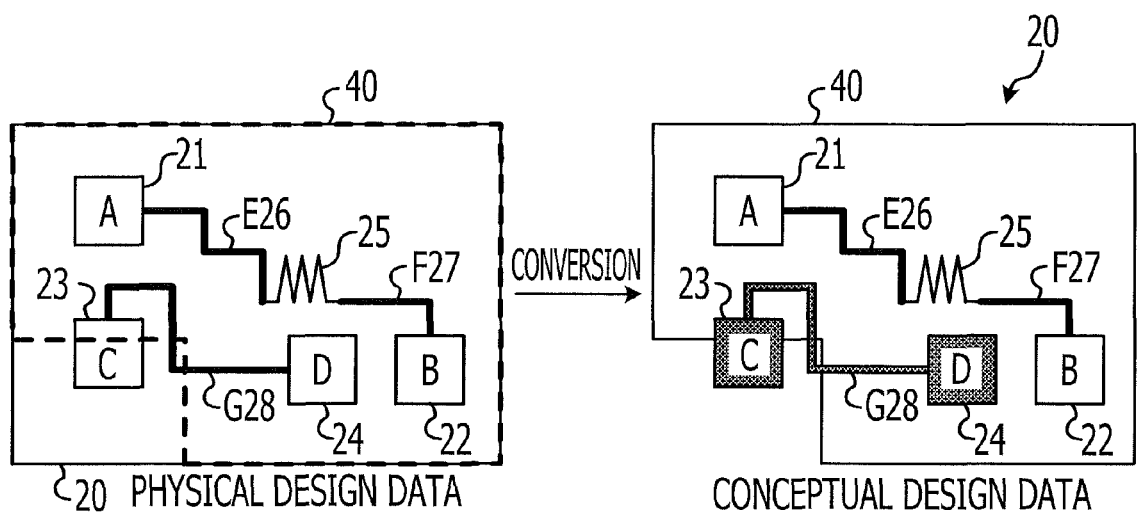
FIG. 9 illustrates an example of the image before and after the change indicated by the image information.

FIG. 9 illustrates an example of the image before and after the change indicated by the image information. According to the example on the left side in FIG. 9, the respective components 21 to 27 of the circuit 20 indicated by the image information 13a before the change by the change unit 14c are illustrated. According to the example on the left side in FIG. 9, in a case where the component out of a region 40 indicated by the casing size information 13d is the component C23, the change unit 14c performs the following process as illustrated in the example on the right side in FIG. 9. That is, the change unit 14c identifies the component C23 out of the region 40. Then, the change unit 14c changes the image information so that a display is made informing that all the components existing in a section from the component C23 itself that transmits the signal flowing through the identified component C23 until the component D24 that receives this signal are the components where the review is recommended. According to the example on the right side in FIG. 9, the change unit 14c changes the image information so that the components C23, D24, and G28 are displayed in red which is more conspicuous than other colors. The image information changed in the above-mentioned manner is used as the image information on the image displayed on the output unit 12 at the time of the conceptual design in the carryover design. Therefore, at the time of the carryover design, the designer who designs the circuit or the like can figure out which component is the component where the review is recommended. With this configuration, it is possible to more efficiently support the carryover design.

It is noted that in a case where the change unit 14c receives an instruction by the user such as the component where the review is recommended via the input unit 11, with regard to the component where the review is recommended, the image information may be changed so that a display is made informing that the review is recommended. Similarly, in a case where the change unit 14c receives an instruction by the user such as the component where the review is not recommended via the input unit 11, with regard to the component where the review is not recommended, the image information may be changed so that a display is made informing that the review is not recommended.

The display unit 14d performs a control so as to display the image indicated by the image information that is changed by the change unit 14c. For example, the display unit 14d outputs the image information changed by the change unit 14c to the output unit 12. With this configuration, by the output unit 12, the image indicated by the image information changed by the change unit 14c is displayed.

The registration unit 14e registers or stores information. For example, the registration unit 14e obtains the arrangement information 13a on the components via the input unit 11 and stores the obtained arrangement information 13a on the components in the storage unit 13. Also, the registration unit 14e obtains the analysis information via the input unit 11 and registers the obtained analysis information in the analysis information DB 13b. Also, the registration unit 14e obtains the revised edition information 13c on the respective components indicated by the arrangement information 13a on the components via the input unit 11 from the component library at predetermined temporal intervals, for example, at intervals of one week and stores the obtained revised edition information 13c in the storage unit 13. Also, the registration unit 14e obtains the casing size information 13d via the input unit 11 and stores the obtained casing size information 13d in the storage unit 13.

The control unit 14 is an integrated circuit such as an ASIC (Application Specific Integrated Circuit) or an FPGA (Field Programmable Gate Array) or an electronic circuit such as a CPU (Central Processing Unit) or an MPU (Micro Processing Unit).

Flow of Process

Figure 10:
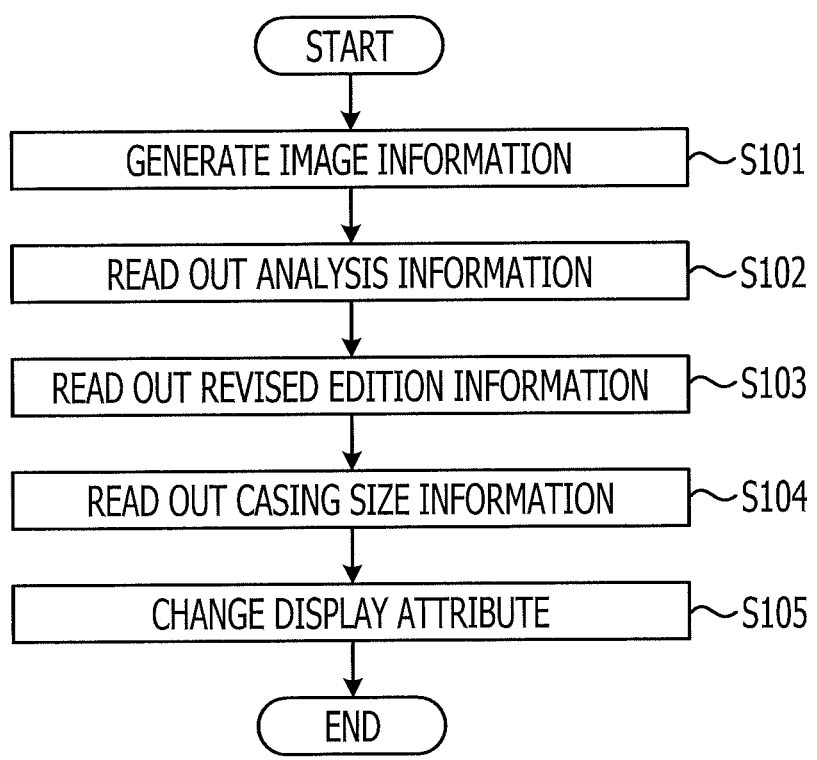
FIG. 10 is a flow chart illustrating a procedure of a support process according to the first embodiment.

Next, a flow of a process by the support apparatus 10 according to the present embodiment will be described. FIG. 10 is a flow chart illustrating a procedure of a support process according to the first embodiment. This support process is executed in a case where an instruction for executing the support process is input from the input unit 11 to the control unit 14.

As illustrated in FIG. 10, the generation unit 14a reads out the arrangement information 13a on the components from the storage unit 13 that stores the analysis information DB 13b in which the arrangement information 13a on the components on the circuit and the analysis information indicating the result of the analysis on the components are registered and generates image information (step S101). The read section 14b reads out the analysis information corresponding to the respective components from the analysis information DB 13b the arrangement of which is indicated by the arrangement information 13a on the components (step S102). The read section 14b reads out the revised edition information 13c stored in the storage unit 13 (step S103). The read section 14b reads out the casing size information 13d stored in the storage unit 13 (step S104). The change unit 14c changes the display attribute of the image information in accordance with the analysis information, the revised edition information 13c, and the casing size information 13d (step S105).

Effect of First Embodiment

As described above, the support apparatus 10 according to the present embodiment reads out the arrangement information 13a on the components from the storage unit 13 that stores the arrangement information 13a on the components and the analysis information indicating the result of the analysis on the components and generates the image information. Then, the support apparatus 10 according to the present embodiment reads out the analysis information corresponding to the components from the storage unit 13. Then, the support apparatus 10 according to the present embodiment changes the display attribute of the image information in accordance with the analysis information, the revised edition information 13c, and the casing size information 13d. Therefore, with the support apparatus 10 according to the present embodiment, it is possible to more efficiently support the carryover design.

Also, in a case where the analysis information indicates that the signal analysis is carried out, the support apparatus 10 according to the present embodiment changes the display attribute of the image information so that a display is made informing that the component corresponding to the analysis information is the component where the review is not recommended. Therefore, with the support apparatus 10 according to the present embodiment, at the time of the carryover design, the designer who designs the circuit or the like can figure out which component is the component where the review is not recommended.

Also, in a case where the analysis information indicates that the signal analysis is carried out and the number of times when the signal analysis is carried out exceeds a predetermined threshold, the support apparatus 10 according to the present embodiment can change the display attribute of the image information so that a display is made informing that the component corresponding to the analysis information is the component where the review is not recommended. With this configuration, the designer or the like can figure out that the component where the designer or the like experiences hardships in the signal analysis while the number of times when the signal analysis is carried out exceeds the predetermined value is the component where the review is not recommended at the time of the carryover design.

Also, the support apparatus 10 according to the present embodiment changes the display attribute of the image information on the basis of the revised edition information 13c of the component so that a display is made informing that the component the revised edition of which is generated is the component where the review is recommended. Therefore, with the support apparatus 10 according to the present embodiment, at the time of the carryover design, the designer who designs the circuit or the like can figure out which component is the component where the review is recommended.

Also, the support apparatus 10 according to the present embodiment changes the display attribute of the image information on the basis of the casing size information 13d on the casing that is the containment unit containing the components so that a display is made informing that the component which is not to be contained in the casing is the component where the review is recommended. Therefore, with the support apparatus 10 according to the present embodiment, at the time of the carryover design, the designer who designs the circuit or the like can figure out which component is the component where the review is recommended.

Incidentally, the embodiment related to the disclosed apparatus has been described in the above, but the present disclosure may also be implemented in various different modes other than the above-mentioned embodiment. In view of the above, other embodiments included in the present disclosure will be described hereinafter.

For example, all or a part of the processes described as being automatically carried out among the processes described according to the first embodiment can also be manually carried out. Also, all or a part of the processes described as being manually carried out among the respective processes described according to the present embodiment can be automatically carried out through a method in related art.

Also, the processes in the respective steps of the respective processes described according to the respective embodiments can be arbitrarily divided or integrated in accordance with various loads, use situations, or the like. Also, a step can be omitted. For example, steps S102, S103, and S104 illustrated in FIG. 10 can be integrated.

Also, the order of the processes in the respective steps of the respective processes described according to the respective embodiments can be changed in accordance with the various loads, the use situations, or the like.

Also, the respective constituent elements of the illustrated respective apparatus are conceptual in terms of functions and may not be configured physically as illustrated in the drawings. That is, specific states of the dispersion and the integration of the respective apparatus are not limited to the illustrated examples, and all or a part of the constituent elements can be configured dispersed or integrated functionally or physically in an arbitrary unit in accordance with the various loads, the use situations, or the like. For example, the generation unit 14a and the read section 14b illustrated in FIG. 1 may be integrated with each other.

Second Embodiment

Support Program

Figure 11:
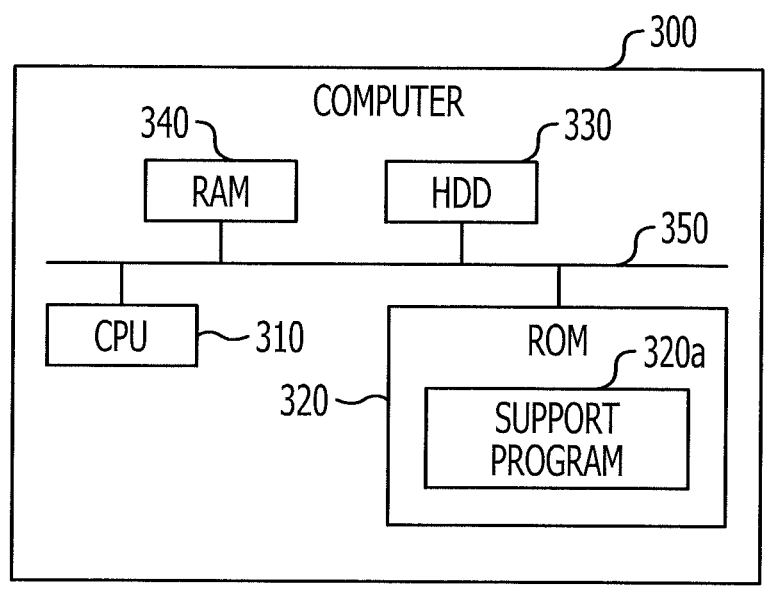
FIG. 11 illustrates a computer that executes a support program.

Also, the various processes by the support apparatus 10 described according to the above-mentioned first embodiment can be realized while a previously prepared program is executed by a computer system such as a personal computer or a work station. In view of the above, hereinafter, by using FIG. 11, an example of a computer that executes a support program having a function similar to the support apparatus described according to the above-mentioned embodiment will be described. FIG. 11 illustrates a computer that executes a support program.

As illustrated in FIG. 11, a computer according to a second embodiment has a CPU (Central Processing Unit) 310, a ROM (Read Only Memory) 320, an HDD (Hard Disk Drive) 330, and a RAM (Random Access Memory) 340. The respective units 310 to 340 are connected via a bus 350.

The ROM 320 previously stores a support program 320a exhibiting a function similar to the generation unit 14a, the read section 14b, and the change unit 14c illustrated according to the above-mentioned embodiment. It is noted that the support program 320a may appropriately be separated.

Then, the CPU 310 reads out the support program 320a from the ROM 320 for execution.

Then, the HDD 330 is provided with arrangement information on components, an analysis information DB, revised edition information, and casing size information. The arrangement information on the components, the analysis information DB, the revised edition information, and the casing size information corresponds to the arrangement information 13a on the components, the analysis information DB 13b, the revised edition information 13c, and the casing size information 13d, respectively.

Then, the CPU 310 reads out the arrangement information on the components, the analysis information DB, the revised edition information, and the casing size information to be stored in the RAM 340. Furthermore, the CPU 310 executes the support program by using the arrangement information on the components, the analysis information DB, the revised edition information, and the casing size information stored in the RAM 340. It is noted that all of the respective pieces of data stored in the RAM 340 may not be stored in the RAM 340, and it suffices that only data used for the process may be stored in the RAM 340.

It is noted that the above-mentioned support program may not be stored in the ROM 320 from the beginning.

For example, the program is stored in "portable physical media" such as a flexible disc (FD), a CD-ROM, a DVD disc, an opto-magnetic disc, and an IC card to be inserted into a computer 300. Then, the computer 300 may read out the program from the media for execution.

Furthermore, the program is stored in "another computer (or a server)" and the like that are connected to the computer 300 via a public line, the internet, a LAN, a WAN, or the like. Then, the computer 300 may read out the program from the other computer and the like for execution.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and changes could be made hereto without departing from the spirit and scope of the invention.

What is claimed is:

1. A non-transitory computer-readable medium storing a support program that, when executed by a computer, causes the computer to execute a process comprising:
    reading out arrangement information on a component of a circuit from a memory that stores the arrangement information and analysis information;
    generating image information from the read out arrangement information;
    reading out the analysis information from the memory, the analysis information indicating a result of an analysis on the component and being information related to whether or not an examination is to be carried out with respect to the component;
    displaying the circuit on a display screen in accordance with the generated image information, the displayed circuit including the component; and
    changing a display attribute of the component in the displayed circuit in accordance with the analysis information read out from the memory, to thereby provide a visual indication in the displayed circuit as to whether or not an examination is to be carried out with respect to the component.

2. The non-transitory computer-readable medium according to the claim 1, wherein
    the circuit includes a plurality of components,
    the memory stores arrangement information on the plurality of components,
    and said changing the display attribute includes:
        changing the display attribute of a respective component in the displayed circuit where a signal analysis is carried out which is indicated by the analysis information and a different component where the signal analysis is not carried out which is indicated by the analysis information, to thereby provide different visual indications in the displayed circuit for said respective component and said different component.

3. The non-transitory computer-readable medium according to the claim 2, wherein the display attribute of said respective component is changed to display said respective component in a color having a lower brightness or saturation as compared with a display of said different component.

4. The non-transitory computer-readable medium according to the claim 1, wherein said changing the display attribute includes:
    changing the display attribute to make a different visual indication of the component in the displayed circuit in the case where a number of times when a signal analysis is carried out exceeds a predetermined threshold as indicated by the analysis information, as compared to a case where the number of times when the signal analysis is carried out does not exceed the threshold as indicated by the analysis information.

5. The non-transitory computer-readable medium according to the claim 4, wherein the display attribute is changed in the case where the number of times when the signal analysis is carried out exceeds the predetermined threshold so that the component is displayed in the circuit in a color having a lower brightness or saturation as compared with the component being displayed in the circuit in the case where the number of times when the signal analysis is carried out does not exceed the threshold.

6. The non-transitory computer-readable medium according to the claim 1, wherein said changing the display attribute further includes:

changing the display attribute on the basis of revised edition information of the component so that the component is displayed in the displayed circuit in a revised edition of which is generated in a color having a higher brightness or saturation as compared with a display of the component with no revised edition.

7. The non-transitory computer-readable medium according to the claim 1, wherein said changing the display attribute further includes:

changing the display attribute on the basis of size information on a containment unit that contains the component to display the component that is not to be contained in the containment unit in a color having a higher brightness or saturation as compared with a display of the component that can be contained in the containment unit.

8. An apparatus comprising:

a memory configured to store arrangement information on a component of a circuit and analysis information; and a processor configured to read out, from the memory, the arrangement information, to generate image information from the read out arrangement information, to read out, from the memory, the analysis information, the analysis information indicating a result of an analysis of the component and being information related to whether or not an examination is to be carried out with respect to the component, to display the circuit on a display screen in accordance with the generated image information, the displayed circuit including the component, and to change a display attribute of the component in the displayed circuit in accordance with the analysis information read out from the memory, to thereby provide a visual indication in the displayed circuit as to whether or not an examination is to be carried out with respect to the component.

9. A method comprising:

reading out arrangement information on a component of a circuit from a memory that stores the arrangement information and analysis information;

generating image information from the read out arrangement information;

reading out the analysis information from the memory, the analysis information indicating a result of an analysis on the component and being information related to whether or not an examination is to be carried out with respect to the component;

displaying the circuit on a display screen in accordance with the generated image information, the displayed circuit including the component; and changing, by a computer, a display attribute of the component in the displayed circuit in accordance with the analysis information read out from the memory, to thereby provide a visual indication in the displayed circuit as to whether or not an examination is to be carried out with respect to the component.

\* \* \* \* \*

UNITED STATES PATENT AND TRADEMARK OFFICE
CERTIFICATE OF CORRECTION

PATENT NO.       : 8,612,924 B2                                Page 1 of 1
APPLICATION NO.  : 13/414136
DATED            : December 17, 2013
INVENTOR(S)      : Akira Arata It is certified that error appears in the above-identified patent and that said Letters Patent is hereby corrected as shown below:

On the Title Page, In Column 1 (Notice), Line 5-6 (Approx.), Delete "This patent is subject to a terminal disclaimer.".

Signed and Sealed this
Twenty-fifth Day of March, 2014

Michelle K. Lee
*Deputy Director of the United States Patent and Trademark Office*